United States Patent
Wang et al.

(10) Patent No.: US 8,294,141 B2
(45) Date of Patent: Oct. 23, 2012

(54) SUPER SENSITIVE UV DETECTOR USING POLYMER FUNCTIONALIZED NANOBELTS

(75) Inventors: Zhong L. Wang, Marietta, GA (US); Changshi Lao, Atlanta, GA (US); Jun Zhou, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 473 days.

(21) Appl. No.: 12/498,605

(22) Filed: Jul. 7, 2009

(65) Prior Publication Data

US 2010/0171095 A1    Jul. 8, 2010

Related U.S. Application Data

(60) Provisional application No. 61/078,607, filed on Jul. 7, 2008, provisional application No. 61/165,191, filed on Mar. 31, 2009.

(51) Int. Cl.
*H01L 35/24* (2006.01)
(52) U.S. Cl. ............ 257/40; 257/14; 257/E51.001
(58) Field of Classification Search ............ 257/14, 257/40, E51.001
See application file for complete search history.

(56) References Cited

U.S. PATENT DOCUMENTS

| | | | |
|---|---|---|---|
| 2,769,867 A | 11/1956 | Crownover et al. |
| 3,594,514 A | 7/1971 | Wingrove |
| 4,099,986 A | 7/1978 | Diepers |
| 4,135,950 A | 1/1979 | Rittner |
| 4,155,781 A | 5/1979 | Diepers |
| 4,352,948 A | 10/1982 | Kaplow et al. |
| 4,450,033 A | 5/1984 | Little |
| 4,748,130 A | 5/1988 | Wenham et al. |
| 5,569,968 A | 10/1996 | Lal et al. |
| 6,137,889 A | 10/2000 | Shennib et al. |
| 6,559,550 B2 | 5/2003 | Herman |
| 6,579,463 B1 | 6/2003 | Winningham et al. |
| 6,586,095 B2 | 7/2003 | Wang et al. |
| 6,882,051 B2 | 4/2005 | Majumdar et al. |
| 6,940,989 B1 | 9/2005 | Shennib et al. |
| 7,047,800 B2 | 5/2006 | Thiesen et al. |
| 7,051,945 B2 | 5/2006 | Empedocles et al. |
| 7,220,310 B2 | 5/2007 | Wang et al. |
| 7,262,515 B2 | 8/2007 | Pinkerton |

(Continued)

FOREIGN PATENT DOCUMENTS

EP    0144774 A2    6/1985

(Continued)

OTHER PUBLICATIONS

Monroy et al. "Wide-bandgap semiconductor ultraviolet photodetectors," Semicond. Sci. Technol. 18(2003) R33-R51.

(Continued)

*Primary Examiner* — Anthony Ho
(74) *Attorney, Agent, or Firm* — Bryan W. Bockhop; Bockhop & Associates, LLC

(57) ABSTRACT

An ultraviolet light sensor includes an elongated metal oxide nanostructure, a layer of an ultraviolet light-absorbing polymer, a current source and a current detector. The elongated metal oxide nanostructure has a first end and an opposite second end. The layer of an ultraviolet light-absorbing polymer is disposed about at least a portion of the metal oxide nanostructure. The current source is configured to provide electrons to the first end of the metal oxide nanostructure. The current detector is configured to detect an amount of current flowing through the metal oxide nanostructure. The amount of current flowing through the metal oxide nanostructure corresponds to an amount of ultraviolet light impinging on the metal oxide nanostructure.

15 Claims, 2 Drawing Sheets

U.S. PATENT DOCUMENTS

| | | |
|---|---|---|
| 7,294,417 B2 | 11/2007 | Ren et al. |
| 7,351,607 B2 | 4/2008 | Wang et al. |
| 2002/0012438 A1 | 1/2002 | Leysieffer et al. |
| 2002/0114945 A1 | 8/2002 | Greenberg et al. |
| 2002/0172820 A1 | 11/2002 | Majumdar et al. |
| 2003/0089899 A1 | 5/2003 | Lieber et al. |
| 2003/0205657 A1 | 11/2003 | Voisin |
| 2004/0114777 A1 | 6/2004 | Aubauer et al. |
| 2004/0127025 A1 | 7/2004 | Crocker, Jr. et al. |
| 2004/0133092 A1 | 7/2004 | Kain |
| 2004/0179709 A1 | 9/2004 | Niederdraenk et al. |
| 2005/0009224 A1 | 1/2005 | Yang et al. |
| 2005/0188751 A1 | 9/2005 | Puskas |
| 2005/0242366 A1 | 11/2005 | Parikh et al. |
| 2006/0008111 A1 | 1/2006 | Nagaoka |
| 2006/0137741 A1 | 6/2006 | Park et al. |
| 2006/0189841 A1 | 8/2006 | Pluvinage |
| 2006/0253278 A1 | 11/2006 | Furst-Yust et al. |
| 2007/0010702 A1 | 1/2007 | Wang et al. |
| 2007/0111368 A1 | 5/2007 | Zhang et al. |
| 2007/0151601 A1 | 7/2007 | Jung et al. |
| 2008/0041446 A1 | 2/2008 | Wu et al. |
| 2008/0067618 A1 | 3/2008 | Wang et al. |
| 2008/0161796 A1 | 7/2008 | Cao et al. |

FOREIGN PATENT DOCUMENTS

| | | |
|---|---|---|
| WO | 9430030 | 12/1994 |
| WO | 9613869 | 5/1996 |

OTHER PUBLICATIONS

Luo et al. "Fabrication and characterization of ZnO nanaowires based UV photodiodes," Sensors and Actuators A 127 (2006) 201-206.

Sharma et al. "Analysis of ultraviolet photoconductivity in ZnO films prepared by unbalanced magnetron sputtering," Journal of Applied Physics vol. 93, No. 7 Apr. 7, 2003.

Jin et al. "Solution-Processed Ultraviolet Photodetectors Based on Colloidal ZnO Nanoparticles," Nano Letters, 2008, vol. 8, No. 6, 1649-1653.

Soci et al. "ZnO Nanowire UV Photodetectors with High Internal Gain," Nano Letters, 2007, vol. 7, No. 4, 1003-1009.

Kind et al. "Nanowire Ultraviolet Photodetectors and Optical Switches," Adv. Mater. 2002, 14, No. 2, 158-160.

Keem et al. "Photocurrent in ZnO nanowires grown from Au electrodes," Applied Physics Letters, vol. 84, No. 22, May 31, 2004, 4376-4378.

Lao et al. "Giant Enhancement in UV Response of ZnO Nanobelts by Polymer Surface-Functionalization," J. Am. Chem. Soc. 2007, 129, 12096-12097.

Ahn et al. "Origin of the slow photoresponse in an individual sol-gel synthesized ZnO nanowire," Applied Physics Letters 90, 153106 2007.

Aga et al. "Enhanced photoresponse in ZnO nanowires decorated with CdTe quantum dot," Applied Physics Letters 91, 232108 2007.

Law et al. "Simple fabrication of a ZnO nanowire photodetector with a fast photoresponse time," Applied Physics Letters 88, 133114 (2006).

Pan et al. "Nanobelts of Semiconducting Oxides," Science vol. 291, March 9, 2001, 1947-1949.

Li et al. "Adsorption and desorption of oxygen probed from ZnO nanowire films by photocurrent measurements,"Applied Physics Letters 86, 123117 (2005).

Nakayama et al. "Tunable nanowire nonlinear optical probe," Nature vol. 447, Jun. 28, 2007.

Pearton et al. "Recent progress in processing and properties of ZnO," Progress in Materials Science 50 (2005) 293-340.

Wang et al. "The new field of nanopiezotronics," Materials Today, May 2007, vol. 10, No. 5, 20-28.

Wang et al. "Piezoelectric Field Effect Transistor and Nanoforce Sensor Based on a Single ZnO Nanowire" Nano Letters, 2006, vol. 6, No. 12, 2768-2772.

Wang et al. "Piezoelectric Nanogenerators Based on Zinc Oxide Nanowire Arrays," Science, vol. 312, (2006) 242-246.

Lao et al. "Polymer functionalized piezoelectric-FET as humidity/chemical nanosensors," Applied Physics Letters 90, 262107 2007.

SUPER SENSITIVE UV DETECTOR USING POLYMER FUNCTIONALIZED NANOBELTS

CROSS-REFERENCE TO RELATED APPLICATION(S)

This application claims the benefit of U.S. Provisional Patent Application Ser. No. 61/078,607, filed Jul. 7, 2008, and U.S. Provisional Patent Application Ser. No. 61/165,191, filed Mar. 31, 2009, the entirety of each of which is hereby incorporated herein by reference.

STATEMENT OF GOVERNMENT INTEREST

This invention was made with support from the U.S. government under grant number DE-FG02-07ER46394, awarded by the Department of Energy and grant number W31P4Q06C0262, awarded by the U.S. Army. The Government has certain rights in the invention.

FIELD OF THE INVENTION

The present invention relates to electronic sensors and, more specifically, to a sensor for ultra-violet light.

DESCRIPTION OF THE PRIOR ART

Ultraviolet (UV) photon detectors have a wide rang of applications from environmental monitoring, missile launching detection, space research, high temperature flame detection to optical communications. For these applications, fast response time, fast reset time, high selectivity, high responsivity, and good signal-to-noise ratio are commonly desired characteristics. Silicon photodiodes, the most common devices used as UV photodetectors, are strongly influenced by visible light and they usually require filters to attenuate unwanted visible and infrared (IR) radiations. For applications that require high-sensitivity, silicon photodiodes need to be cooled to a low temperature to reduce the dark current.

For UV photon detectors based on polycrystalline zinc oxide thin film, a slow response time ranging from a few minutes to several hours is commonly observed. Due to large surface-to-volume ratio and reduced dimensionality of the active area, zinc oxide nanostructures are expected to have high photon conductance. Most of the studies have been focused on the mechanism investigation and improving the sensitivity. However, little attention has been paid on improving the response and recovery time especially the reset-time (defined as the time need to recovery to 1/e (37%) of the maximum photocurrent), which may limit the applications of zinc oxide nanowire nanosensors for fast UV detection and imaging.

Therefore, there is a need for an ultraviolet sensor that exhibits a fast response time, a fast reset time, a high selectivity, a high responsivity, and a good signal-to-noise ratio.

There is also a need for UV photodetectors that can be fabricated at low cost and that are able to work at room temperature.

SUMMARY OF THE INVENTION

The disadvantages of the prior art are overcome by the present invention which, in one aspect, is an ultraviolet light sensor that includes an elongated metal oxide nanostructure, a layer of an ultraviolet light-absorbing polymer, a current source and a current detector. The elongated metal oxide nanostructure has a first end and an opposite second end. The layer of an ultraviolet light-absorbing polymer is disposed about at least a portion of the metal oxide nanostructure. The current source is configured to provide electrons to the first end of the metal oxide nanostructure. The current detector is configured to detect an amount of current flowing through the metal oxide nanostructure. The amount of current flowing through the metal oxide nanostructure corresponds to an amount of ultraviolet light impinging on the metal oxide nanostructure.

In another aspect, the invention is an ultraviolet light sensing element. An elongated metal oxide nanostructure has a first end and an opposite second end. An ultraviolet light-absorbing polymer is disposed so as to envelope the metal oxide nanostructure.

In yet another aspect, the invention is a method of making an ultraviolet light sensing element, in which an elongated metal oxide nanostructure having a first end and an opposite second end is grown. A portion of the metal oxide nanostructure is functionalized with an ultraviolet light-absorbing polymer.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
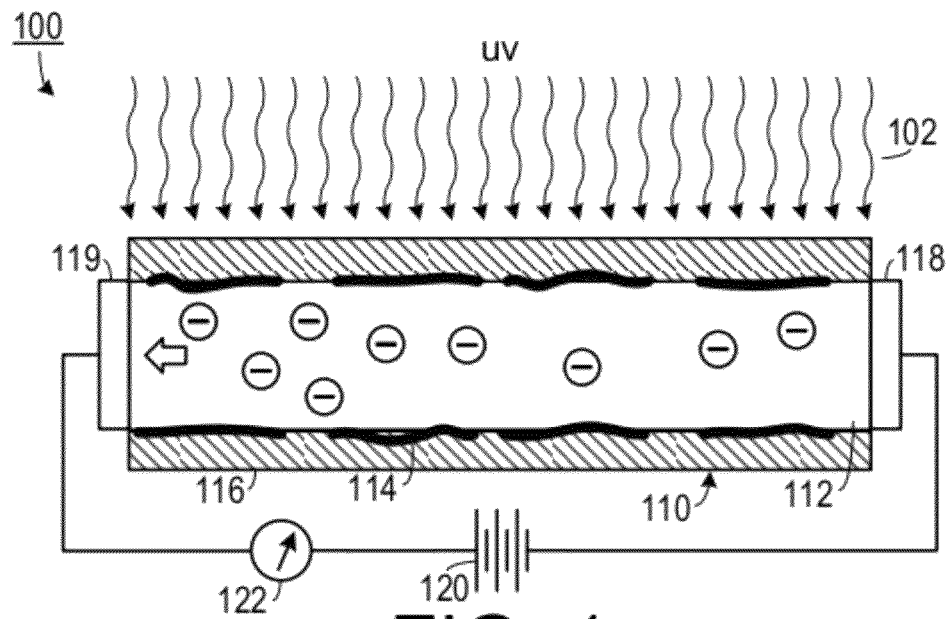
FIG. 1 is a schematic diagram of one embodiment of an ultraviolet light sensing element.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on." Also as used herein, "nanobelt" includes elongated nanostructures such as nanowires and nanotubes.

U.S. Pat. Nos. 6,586,095, 6,918,959 and 7,220,310 and 7,351,607, all issued to Wang et al., disclose methods for making metal oxide nanostructures, the entirety of each of these patents is incorporated herein by reference for the purpose of disclosing methods of generating metal oxide nanostructures.

As shown in FIG. 1, one embodiment of an ultraviolet (UV) sensor 100 includes an ultraviolet light sensing element 110 coupled to a source 120 of current and an element 122 configured to sense current flowing through the ultraviolet light sensing element 110. Typically, element 122 would of a type selected from the many different types of solid-state current sensors, depending upon the specific application.

The sensing element 110 includes an elongated metal oxide nanostructure 112 (such as a nanobelt or nanowire) about which is disposed a layer of a polymer 116 that absorbs UV light. In one embodiment, the UV light-absorbing polymer includes polystyrene sulfate (PSS). However, other UV light-absorbing polymers that may be employed include poly(styrene-co-maleic acid) (PS-co-MAc), anionically charged poly(N-isopropylacrylamide) (PNIPAM), carboxymethylcellulose (CMC).

A first contact 118 is applied to a first end of the nanostructure 112 and a second contact 119 is applied to a second end of the nanostructure 112. In one embodiment, both contacts comprise an Ohmic contact. In another embodiment, the first contact 118 comprises a metal, such as platinum, so as to create a Schottky barrier between the first contact 118 and the first end of the nanostructure 112, whereas the second contact 119 includes a material that forms an Ohmic contact with the second end of the nanostructure 112. In one embodiment, the second contact 119 includes a Pt:Ga electrode.

PSS has a negative surface charge, as does zinc oxide. Therefore, in the embodiment where the layer of a polymer 116 that absorbs UV light includes polystyrene sulfate (PSS), an intermediate layer 114 of a polymer having a positive surface charge is disposed at least intermittently between the metal oxide nanostructure 112 and the layer of UV light absorbing polymer 116. One example of a suitable polymer having a positive surface charge includes poly(diallyl dimethyl-ammonium chloride) (PDAMAC).

Figure 2:
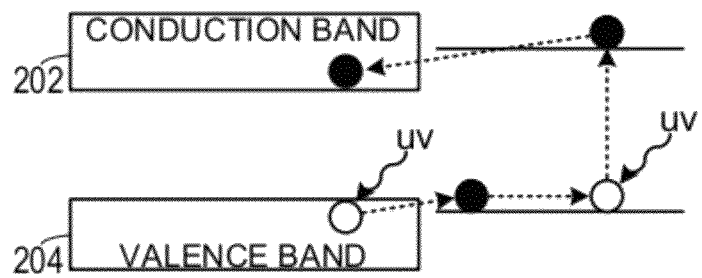
FIG. 2 is a block diagram showing a possible electron transport mechanism occurring in the embodiment shown in FIG. 1.

As shown in FIG. 2, it is believed that the absorption peak and the related molecular energy states in PSS play a significant role for enhancing the photon response of the sensing element 100. Although the zinc oxide nanostructure 112 surface is covered by PDADMAC, it is well known that the monolayer adsorption usually cannot reach 100% coverage. Therefore, the remaining surface could be covered by the UV light absorbing layer 116 of PSS. When subjected to UV light, an electron in PSS is excited from the ground state energy state to an exited energy state due to high absorption, which creates an unoccupied energy state. If the ground energy state of the PSS is at the level within the band gap of zinc oxide, it is possible that the electron in the valence band 204 of zinc oxide nanostructure 112 is likely to be excited to the ground state of PSS, which subsequently transits to the conduction band 202 of the zinc oxide nanostructure 112. This "hopping" process may largely enhance the transition probability of the valence electrons in zinc oxide to the conduction band 202, resulting in a large increase in the number of electron-hole pairs. The role played by PSS is to serve as a hopping-state or bridge for the electron transfer. The generated holes may be trapped at the nanostructure surface by the PDADMAC, while the electrons are transported through the nanostructure core. Therefore, the conjunction of electron-hole pair generation in zinc oxide with the assistance of PSS and surface hole trapping effect by PDADMAC may largely prevent the electron-hole recombination, resulting in a substantial increase in the photo-conductance of the PSS coated zinc oxide nanostructure 112.

Figure 3:
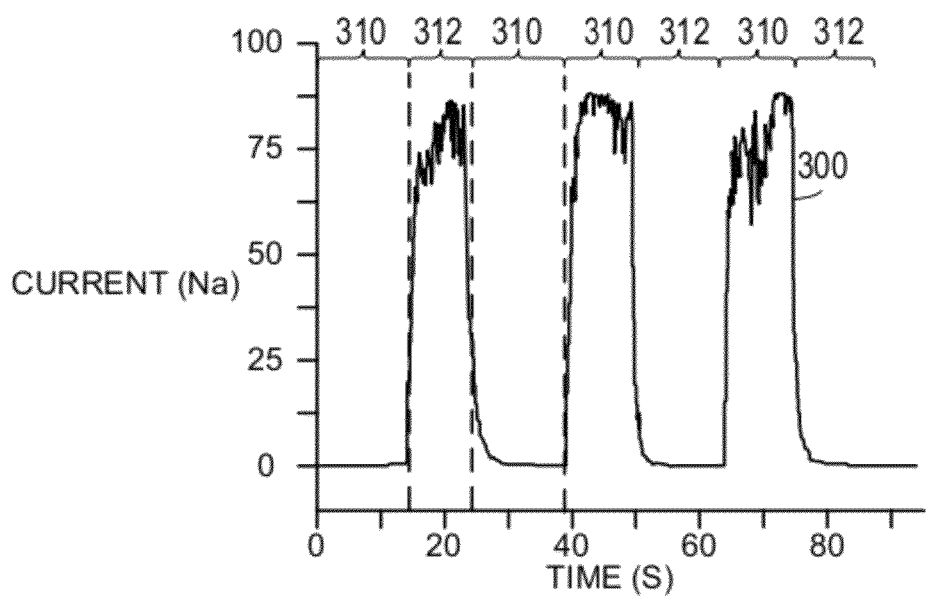
FIG. 3 is a graph showing current as a function of time in an experimental embodiment of a light sensing element as an ultraviolet light source is cycled between "on" and "off"

As shown in FIG. 3, in a current vs. time graph 300, one experimental embodiment exhibits almost no current through the elongated nanostructure during periods 310 when the sensing element was not subjected UV light. However, a substantial increase in current flowed through the nanostructure during periods 312 when the sensing element was subjected to UV light.

Figure 4:
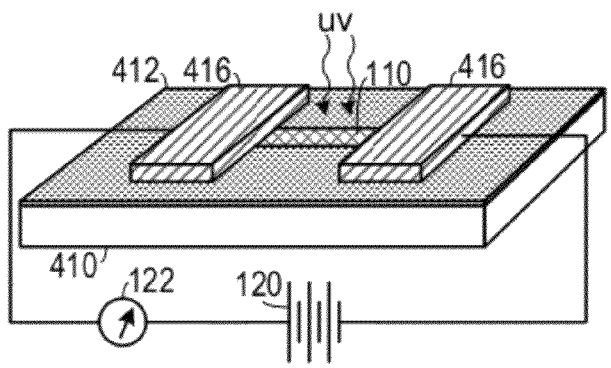
FIG. 4 is a perspective view of an experimental embodiment of an ultraviolet light sensor.
Figure 5:
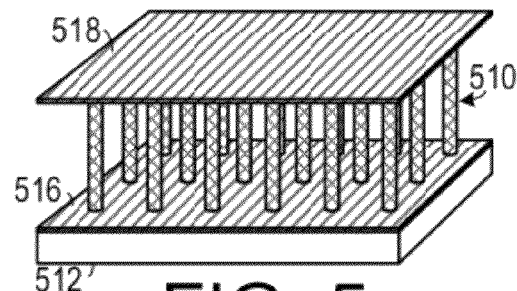
FIG. 5 is a perspective view of an embodiment of an ultraviolet light sensing element that employs vertically-disposed nanowires.

One experimental embodiment, as shown in FIG. 4, employed a silicon substrate 410 upon which was deposited a layer of silicon dioxide 412. A polymer-functionalized nanobelt 110 was disposed on the silicon dioxide layer 412 and two oppositely-disposed gold/titanium contacts were deposited on the silicon dioxide layer 412 so as to be in contact with the nanobelt 110.

An embodiment employing a plurality of vertically-disposed nanowires 510 are grown from a first end contact layer 516 and a second end contact layer 518 is disposed adjacent the tops of the vertically-disposed nanowires 510 so as to be in contact therewith. A substrate 512 may provide a platform for the first end contact layer 516.

Figure 6A:
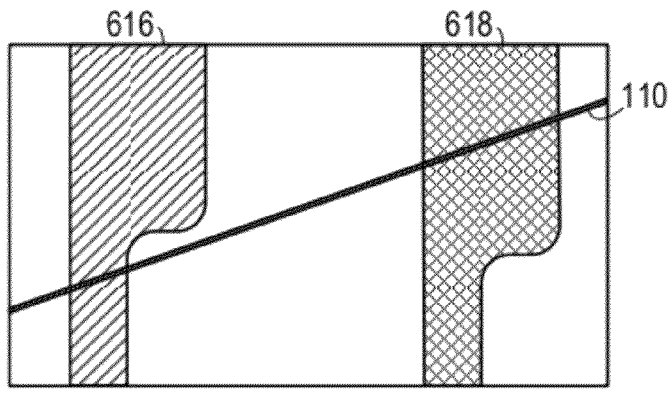
FIG. 6A is an embodiment of an ultraviolet light sensing element that employs a Schottky contact.
Figure 6B:
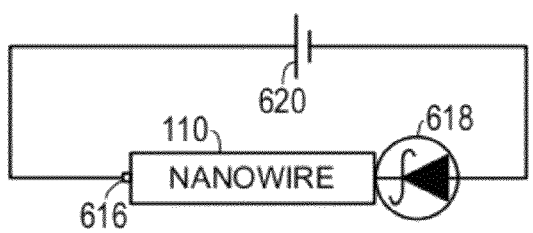
FIG. 6B is a schematic diagram of an ultraviolet light sensor that employs the ultraviolet light sensing element shown in FIG. 6A

As shown in FIG. 6A, depositing a metal contact 618 (e.g., platinum) at a first end of the nanostructure 110 so as to create a Schottky barrier between the nanostructure 110 and the metal contact 618 reduces reset time. An Ohmic contact 616 is deposited at the second end of the nanostructure 110. This embodiment is shown schematically in FIG. 6B, in which an electron source 620 has been added.

Figure 7:
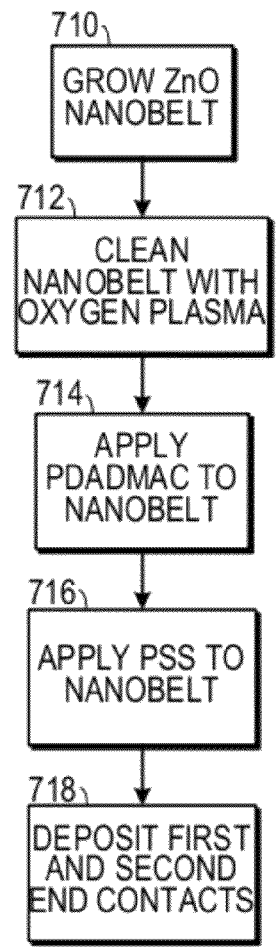
FIG. 7 is a flow chart demonstrating one method of making ultraviolet light sensing element.

One method of making a UV light sensing element is shown in FIG. 7, in which an elongated zinc oxide nanostructure is grown 710, typically on a substrate. The nanostructure is cleaned 712 (e.g. with an oxygen plasma) to remove impurities. A polymer having a positive surface charge (e.g., PDADMAC) is applied to the nanostructure. A UV light absorbing polymer (e.g., PSS) is then applied to the nanostructure 716 and a pair of contacts is deposited at the ends of the nanostructure 718.

In one representative experimental embodiment, an effective way of improving both the sensitivity and reset time of zinc oxide nanowire nanosensors employed Schottky type (Schottky type) devices instead of Ohmic type (OT) devices. In this embodiment, the UV sensitivity of zinc oxide nanowire nanosensor was improved by four orders of magnitude, and the reset-time was decreased from about 417 seconds to about 0.8 seconds. By further surface coating with positive charged poly(diallydimethylammonium chloride) (PDADMAC) and negative charged poly(sodium 4-styrenesulfonate) (PSS), the reset-time was decreased to about 20 milliseconds even without correcting the electronic response of the measurement system.

The zinc oxide nanowires for the nanosensor fabrication were synthesized by thermal evaporation of zinc oxide powders without using any catalyst. UV response of the devices was characterized by a portable UV lamp (Spectroline, Model ENF-280C, 365 nm). The photon-response spectrum measurement was carried out in a PTI QuantaMaster Luminescence (QM 3PH) system. All of the measurements were carried out at room temperature in ambient condition.

First studied was the performance of an Ohmic-contact zinc oxide nanowire nanosensor. To make an Ohmic contact, Ti/Au electrodes were deposited on a single zinc oxide nanowire through shadow mask technology. The high linear I-V characteristic of the device in darkness indicated that the device was Ohmic as expected. By illuminating the device using a 365 nm UV source at a power density of about 30

μW/cm², the photon-conductance was improved by about 15%. After about 260 seconds continuous illumination, the current was still unsaturated. More importantly, the reset time of the sensor was about 417 seconds, and the current could not recovery to its initial state even after about 2500 seconds.

The slow UV response and recovery of the Ohmic zinc oxide nanowire nanosensor may be attributed to the oxygen adsorption and desorption process. In darkness, oxygen molecules adsorb on the zinc oxide nanowire surface by capturing free electrons from the n-type zinc oxide $[O_2(g)+e^-\rightarrow O_2^-$ (ad)], thereby creating a depletion layer with low conductivity near the surface. Upon UV illumination at photon energies above the zinc oxide band gap, electron-hole pairs are generated $[hv\rightarrow e^-+h^+]$. Photon-generated holes migrate to the surface discharge the adsorbed oxygen ions $[O_2^-(ad)+h^+\rightarrow O_2$ (g)] to photon-desorbed oxygen from the surfaces. The unpaired electrons accumulate gradually with time until desorption and re-adsorption of $O_2$ reach an equilibrium state, resulting in a gradual current rise until saturation during UV illumination. Although holes recombine quickly with electrons upon turning off UV light, there are still a lot of electrons left in the zinc oxide. $O_2$ molecules gradually re-adsorb on the surface and capture these electrons, which results in a slow current decay.

The sensitivity of Ohmic-type zinc oxide nanowire UV nanosensor can be improved by using small size nanowires. However, the reset time is still on the order of few hundred second or even longer. Such a performance may not be adequate for sensor application especially used for UV detection purpose at a high frequency.

The Schottky type zinc oxide nanowire nanosensors were fabricated by the following process. First, patterned platinum microelectrode arrays were fabricated on a $SiO_2$/Si substrate by UV lithography and e-beam evaporation process. Second, a single zinc oxide nanowire was placed on the electrodes using a dry printing process. Finally, focus ion beam microscopy was used to deposit a Pt:Ga electrode on one end of zinc oxide nanowire to make a good Ohmic contact. Platinum was deposited on the other end to form a Schottky contact.

The I-V characteristics of the Schottky type zinc oxide nanowire nanosensor both in the dark and upon about 30 μW/cm²365 nm UV light illumination indicated that the nanosensor was more sensitive when the Schottky barrier was reversely biased. The response behavior of the device was characterized by measuring the current under fixed bias of 1 V (the Schottky barrier was reversely biased) as a function of time when the device was periodically exposed to the UV light. The current increased from 0.04 nA to 60 nA within 0.6 seconds, which is nearly 1500-fold enhancement in response. When the UV light was turned off, the current decreased to reach its initial state within 6 seconds with a reset-time of 0.8 seconds. The decay time of the photon-response follows a second-order exponential decay function, with estimated time constant of $\tau_{d1}$=0.52 s and $\tau_{d2}$=1.47 seconds, and relative weight factors of 64% and 36%, respectively. The differences in device performances between the two types of nanosensors can therefore attribute to the Schottky barrier at the zinc oxide/Pt interface.

It's well known that metal Pt (work function of about 6.1 eV) and n-type zinc oxide (work function of about 5.1 eV) can form a Schottky contact, and the adsorbed oxygen at the metal/semiconductor interface can significant modify the Schottky barrier. Normally, the presence of a Schottky barrier at the metal/semiconductor interface plays a crucial role in determining the electrical transport property of the structure. At a fixed bias voltage, the voltage drop occurs mainly at the reversely biased Schottky barrier. When the reverse-biased Schottky contact is illuminated by 365 nm UV, photon-generated electrons and holes in the interface region are separated by the strong local electric field and, thus, reduce the electron-hole recombination rates and increase the carrier lifetime, resulting in an increase in free carrier density. The photon-desorption of oxygen at the zinc oxide/platinum interface modifies the density of defects states and, hence, alters the Schottky barrier. Both of the two processes may lower the height and narrow the width of the Schottky barrier, thus electrons may transit over the lowered height of the Schottky barrier or tunnel through the narrowed width of the Schottky barrier. This mechanism accounts for the enhanced UV response. The more rapid photocurrent decay in the Schottky type device is mostly dictated by the electrical transport property of the Schottky barrier. Upon turning off the UV light, the photon-generated electrons and holes in the interface region decreased dramatically, and the oxygen is only required to be re-adsorbed close to the interface to modify the Schottky barrier height. It should be noted that, as the Schottky barrier can be modified by many effects (such as surface absorption, strain, etc.), the long time performance stability and reliability of the Schottky type device may be affected, but surface passivation may protect the device.

The response speed of the Schottky type zinc oxide nanowire nanosensor can be further enhanced by surface functionalization. Positive charged PDADMAC and negative charged PSS layers were sequent coated on the device by a layer-by-layer self-assembly method. The polymer coated device has no response to visible light. However, a sharp response was detected when the device was exposed to 365 nm UV light, indicating that the Schottky type zinc oxide nanowire nanosensor is still UV selective after surface coating. The current increased from 0.3 nA to 200 nA within 120 ms under about 30 μW/cm²UV illumination. When the UV light was turned off, the current decreased to 37% of its initial photo-current within 110 ms. The decay time of the photo-response follows a second-order exponential decay function, with estimated time constant of $\tau_{d1}$=0.084 s and $\tau_{d2}$=0.88 s, and relative weight factors of 88% and 12%, respectively. It should be noted that the response time of the measurement system itself was set at 100 ms, thus the real reset time the device should be much shorter than 110 ms.

The reset-time of the device was measured by setting the response time as 10 ms. Although the noise level was high, the photon current decreased from about 270 nA to about 50 nA in 20 ms, indicating that the real reset-time of the device is less than 20 ms in the order of a few ms.

The mechanism for giant improvement of the UV response speed by surface coating is not fully understood yet. The polymer molecules may largely occupy the sites at which the adsorbed and ionized oxygen tend to occupy. Thus the UV response of device was dominated by the photon-generated electrons and holes, the recombination of which in the zinc oxide/platinum interface region is rather fast. But the oxygen adsorption and desorption process are usually slow. It is known that surface functionalization using polymers that have large UV absorption peak can largely increase the UV response of the nanosensor. A rise in response profile naturally improves the recovery time in a relatively scale.

Utilizing of Schottky contacts and surface functionalization has been demonstrated as an effective way for improving response speed especially the reset-time of zinc oxide nanowire UV nanosensors. The fast UV response speed, high spectrum selectivity combined with high photosensitivity suggest the possibility of using zinc oxide nanowires as "visible-blind" UV sensors for commercial, military, and space applications. Beside the UV sensors, embodiments of the present invention may also improve the performance of gas sensors, strain sensors and biosensors by employing Schottky contacts introduced in device fabrication, which is distinctly different from the conventionally designed devices with Ohmic contacts.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. An ultraviolet light sensor, comprising:
    a. an elongated metal oxide nanostructure having a first end and an opposite second end;
    b. a layer of an ultraviolet light-absorbing polymer disposed about at least a portion of the metal oxide nanostructure;
    c. a current source configured to provide electrons to the first end of the metal oxide nanostructure; and
    d. a current detector configured to detect an amount of current flowing through the metal oxide nanostructure, wherein the amount of current flowing through the metal oxide nanostructure corresponds to an amount of ultraviolet light impinging on the metal oxide nanostructure.

2. The ultraviolet light sensor of claim 1, further comprising:
    a. a metal contact coupled to the first end of the metal oxide nanostructure, the metal contact comprising a metal that creates a Schottky barrier between the metal contact and the metal oxide nanostructure; and
    b. an Ohmic contact coupled to the second end of the metal oxide nanostructure.

3. The ultraviolet light sensor of claim 2, wherein the ultraviolet light-absorbing polymer comprises polystyrene sulfate, the ultraviolet light sensor further comprising a layer of a polymer having a positive surface charge disposed at least intermittently between the metal oxide nanostructure and the polystyrene sulfate.

4. The ultraviolet light sensor of claim 3, wherein the polymer having a positive surface charge comprises poly (diallyl dimethyl-ammonium chloride).

5. The ultraviolet light sensor of claim 1, wherein the metal oxide nanostructure comprises zinc oxide.

6. The ultraviolet light sensor of claim 1, wherein the metal oxide nanostructure comprises a nanobelt.

7. The ultraviolet light sensor of claim 1, wherein the metal oxide nanostructure comprises a nanowire.

8. The ultraviolet light sensor of claim 1, wherein the ultraviolet light-absorbing polymer comprises a polymer selected from a group consisting of: polystyrene sulfate, poly (styrene-co-maleic acid), anionically charged poly(N-isopropylacrylamide), carboxymethylcellulose, and combinations thereof.

9. An ultraviolet light sensing element, comprising:
    a. an elongated metal oxide nanostructure having a first end and an opposite second end;
    b. an ultraviolet light-absorbing polymer disposed so as to envelope the metal oxide nanostructure;
    c. a metal contact coupled to the first end of the metal oxide nanostructure, the metal contact comprising a metal that creates a Schottky barrier between the metal contact and the metal oxide nanostructure; and
    d. an Ohmic contact coupled to the second end of the metal oxide nanostructure.

10. The ultraviolet light sensing element of claim 9, wherein the metal oxide nanostructure comprises zinc oxide.

11. The ultraviolet light sensing element of claim 9, wherein the metal oxide nanostructure comprises a nanobelt.

12. The ultraviolet light sensing element of claim 9, wherein the metal oxide nanostructure comprises a nanowire.

13. The ultraviolet light sensing element of claim 12, wherein the ultraviolet light-absorbing polymer comprises polystyrene sulfate, the ultraviolet light sensing element further comprising a layer of a polymer having a positive surface charge disposed at least intermittently between the metal oxide nanostructure and the polystyrene sulfate.

14. The ultraviolet light sensing element of claim 13, wherein the polymer having a positive surface charge comprises poly(diallyl dimethyl-ammonium chloride).

15. The ultraviolet light sensing element of claim 9, wherein the ultraviolet light-absorbing polymer comprises a polymer selected from a group consisting of: polystyrene sulfate, poly(styrene-co-maleic acid), anionically charged poly(N-isopropylacrylamide), carboxymethylcellulose, and combinations thereof.

* * * * *